United States Patent [19]

Demmer et al.

[11] Patent Number: 4,570,126

[45] Date of Patent: Feb. 11, 1986

[54] FM DEMODULATOR USING INTERPOLATION TO APPROXIMATE ZERO CROSSINGS

[75] Inventors: Walter H. Demmer; Rolf D. Gutsmann; Norbert A. Bergs; Ingolf B. Heinemann; Otto L. Warmuth, all of Hamburg, Fed. Rep. of Germany

[73] Assignee: U.S. Philips Corporation, New York, N.Y.

[21] Appl. No.: 507,202

[22] Filed: Jun. 23, 1983

[30] Foreign Application Priority Data

Jun. 23, 1982 [DE] Fed. Rep. of Germany ....... 3223345

[51] Int. Cl.⁴ .............................................. H03D 3/00
[52] U.S. Cl. .................................... 329/107; 329/110; 329/126; 329/145; 375/82; 455/214
[58] Field of Search ............... 329/107, 110, 126, 145; 375/44, 80, 82, 94; 455/214

[56] References Cited

U.S. PATENT DOCUMENTS 4,021,744  5/1977  Montefusco ..................... 329/126 X
4,412,339 10/1983  Alfke et al. ....................... 375/82 X

FOREIGN PATENT DOCUMENTS 2809418  9/1979  Fed. Rep. of Germany ........ 375/80

*Primary Examiner*—Eugene R. LaRoche
*Assistant Examiner*—D. C. Mis
*Attorney, Agent, or Firm*—Thomas A. Briody; William J. Streeter; Edward W. Goodman

[57] ABSTRACT

For determining the half-cycle durations of the input signal which is presented as a sequence of sampled values, its zero crossings are approximated by lines which interconnect the two sampled values of different signs on both sides of the zero crossing. The half-cycle duration is derived from the number of sampled values within a period, i.e. between two consecutive zero crossings, and from the time intervals at the beginning and end of each half-cycle determined by the intersection of the approximation line with the axis. The time intervals at the beginning and end of each period are corrected for a more accurate determination of the duration and the time intervals during which the values of the individual half-cycle durations are stored, are made to approximate to these half-cycle durations. The instantaneous frequency of the input signal is determined from the values of the half-cycle durations which have thus been shifted in time by forming the reciprocal.

15 Claims, 6 Drawing Figures a)

b)

c)

d)

e)

FM DEMODULATOR USING INTERPOLATION TO APPROXIMATE ZERO CROSSINGS

BACKGROUND OF THE INVENTION

The invention relates to a method of demodulating a frequency-modulated periodic input signal by determining the duration of each half-cycle between every two adjacent zero crossings of the input signal, which signal appears in the form of a sequence of digitized samples taken from the input signal at regular intervals, and by generating the reciprocals of the duration of the half-cycles. The invention also relates to an arrangement for carrying out the method.

A similar method for input signals in purely analog form is known in which the duration of each half-cycle between every two adjacent zero crossings is determined by counting a reference clock signal whose frequency is high in comparison with the highest frequency of the input signal. The number of reference-clock pulses counted between two adjacent zero crossings constitutes a digital representation of the duration of the half-cycle. If the half-cycle duration must be determined with a high resolution, the frequency of the reference clock signal must be increased proportionally relative to the input-signal frequency. In the case of high-frequency input signals, such as the frequency-modulated luminance signal in a color video signal read from a magnetic tape, the reference clock frequency must be so high that the counting circuits required for this are impracticable or become too intricate and expensive.

SUMMARY OF THE INVENTION

It is the object of the invention to provide a method of the type mentioned in the opening paragraph in which the frequencies of the required clock or other auxiliary signals are of the order of magnitude of the frequency with which the sequence of samples of the input signal recurs, so that digital electronic circuits with a lower operating speed may be used.

According to the invention this object is achieved in that the duration $\tau$ of each half-cycle is derived from the sum of the time intervals T corresponding to the number n of samples between the adjacent zero crossings and the time intervals $t_n$, $t_m$ between each zero crossing and the sample which directly precedes it, using the following relationship:

$$\tau = (T - t_n) + nT + t_m$$
$$= t_m - t_n + (n + 1)T$$

the time intervals $t_n$ and $t_m$ each being derived from two consecutive samples $a_n$, $a_{n+1}$ and $a_m$, $a_{m+1}$ respectively of different signs at the location of the zero crossings, using the following relationship:

$$t_n = T \frac{|a_{n-1}|}{|a_{n-1} - a_n|}$$

$$t_m = T \frac{|a_{m-1}|}{|a_{m-1} - a_m|}$$

In this way the duration of each half-cycle is derived from full periods T of the samples and from fractions thereof, which are obtained from the two adjacent samples by a linear approximation to the input signal at the location of the zero crossings. The resolution of determining the duration of each half-cycle then does not depend on a high-frequency clock signal but on the resolution, i.e. the precision, of the samples. The required computation can be effected within the time intervals between two consecutive samples, or in the case of a plurality of computing operations, within a multiple thereof, if a pipeline structure is used for carrying out the method. When calculating the duration of the next half-cycle, the second time interval $t_m$ may be used as the first time interval $t_n$.

It is obvious that the accuracy of the linear approximation to a sinusoidal input signal at the location of the zero points, increases as the number of samples within one half-cycle increases. However, if only a few samples, for example less than two, occur within one half-cycle of the input signal, a distinct error will arise owing to the linear approximation. In such a case it is effective to use a variant of the method in accordance with the invention in which, prior to the determination of the half-cycle duration, each time interval $t_n$, $t_m$ is corrected by a correction value which depends on the value of said time interval. Moreover, a further correction is possible using the value of the duration of the preceding half-cycle, because, in general, it is assumed that the frequency contained in the input signal does not change abruptly from one half-cycle to the next.

The duration of each half-cycle is determined with the first sample after the end of this half-cycle, i.e. after the zero crossing with which this half-cycle terminates. The value thus determined is preserved until the duration of the next half-cycle has been determined. This means that the value of the duration of a half-cycle remains available for the length of the next half-cycle whose duration may differ from that of the preceding half-cycle, so that values of short half-cycle durations are maintained too long and those of long half-cycle durations too short, resulting in a shift relative to the correct demodulated signal. In order to preclude this, it is effective, in accordance with a further variant, if the duration $\tau$ determined for each half-cycle is stored for a time interval equal to the interval between a number of samples which is 1 higher than the number of samples between the first of the two adjacent zero crossings and the preceding zero crossing. Such a method can simple be carried out by means of a delay device, as will be explained hereinafter.

The above variant of the method in accordance with the invention still gives rise to small errors as a result of time shifting, because the value of the duration of a half-cycle always coincides with or has a constant shift relative to the instant at which a sample appears, while the actual zero crossing occurs at an arbitrary instant between two samples. In order to minimize the effect of this statistically varying time error, it is effective, in accordance with a further variant of the inventive method, if a period $\tau_{nk}$ is assigned to the time interval between the consecutive samples $a_n$, $a_{n+1}$ at the location of the first one of the two zero crossings which period, depending on the time interval $t_n$ between this zero crossing and the preceding sample, is situated between the period $\tau_{n-1}$ determined before this zero crossing and the last period determined $\tau_n$ in conformity with the following relationship:

$$\tau_{nk} = \frac{t_n}{T}(\tau_{n-1} - \tau_n) + \tau_n.$$

In this way an intermediate value is inserted at the location of the zero crossing during the change from the value of one half-cycle duration to that of the next half-cycle, so that a smoother transition between the values is obtained, which results in a better approximation to the variation of the frequency of the input signal.

DESCRIPTION OF THE DRAWINGS

Embodiments of the invention will now be described in more detail, by way of example, with reference to the drawings. In the drawings.

DESCRIPTION OF THE PREFERRED EMBODIMENTS

Figure 1:
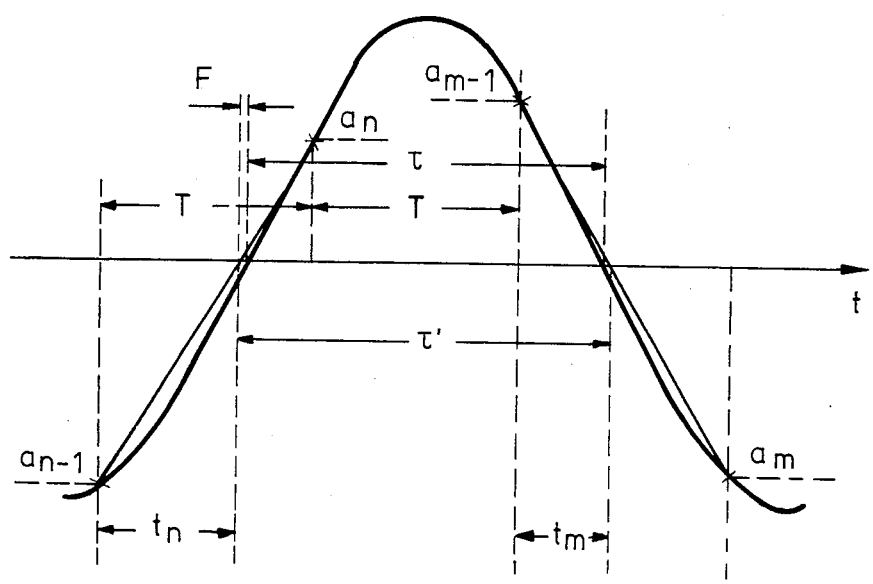
FIG. 1 is a timing diagram which illustrates how the half-cycle duration of a frequency-modulated sinusoidal input signal is determined by a linear approximation to the zero crossings.

FIG. 1 shows a full period of a sinewave signal whose half-cycle $\tau$ is to be determined by digital means. For this purpose the input signal is available in the form of a sequence of samples, of which the samples $a_{n-1}$, $a_n$, $a_{m-1}$, $a_m$ are shown. If the samples are situated closer to each other in relation to the signal, i.e. if the signal frequency is low relative to the sample frequency $1/T$ (T is the period of the samples, i.e. the distance between two consecutive samples), further samples will be situated between the samples $a_n$ and $a_{m-1}$. However, this is not essential for the following explanation.

The zero crossings of the signal determine the half-cycle duration and thus its frequency. However, since the sampled values are discrete in time, the zero-crossings are approximated by a straight connecting line between the two sampled values and, from the time intervals defined by the intersections of this approximation line with the axis, an approximated value $\tau'$ of the desired period is derived. From the time intervals $t_n$ and $t_m$ between an intersection with an approximation line and the preceding sampled value and from the number n of samples between two adjacent zero crossings, the approximated value for the half-cycle duration can then be derived as follows in conformity with FIG. 1:

$$\tau' = (T - t_n) + n \cdot T + t_m \quad (1)$$
$$= t_m - t_n + (n + 1)T$$

The duration of the time interval $t_n$ can be derived from the values $a_{n-1}$ and $a_n$ of the two adjacent samples and from their distance T in accordance with the set of radii in the following manner:

$$\frac{t_n}{|a_{n-1}|} = \frac{T}{|a_{n-1} - a_n|} \quad (2)$$

-continued
$$t_n = \frac{|a_{n-1}|}{|a_{n-1} - a_n|} \cdot T$$

In a similar way, the duration of the time interval $t_m$ can be derived. These time intervals can be determined after each other, the previously determined time interval $t_n$ being stored temporarily, and the approximated value $\tau'$ of the half-cycle duration is derived from the buffered time interval $t_n$ and the instantaneously computed time interval $t_m$ in accordance with equation (1).

As will be seen in FIG. 1, the deviation of intersection of the approximation line, which extends through the two adjacent sampled values, with the axis from the actual zero crossing of the signal, corresponds to an error F. This error, as is evident from FIG. 1, depends on the positions of the two sampled values relative to the zero crossing and hence it depends directly on the value of the time interval $t_n$. If a sampled value happens to coincide with a zero crossing, i.e. if $t_n = 0$ or $t_n = T$, the error is also equal to 0. If the two sampled values are disposed exactly symmetrically relative to the zero crossing, i.e. if $t_n = 0.5$, the error is also 0 in the case of a purely sinusoidal signal, the errors on both sides of this value for $t_n$ having different signs.

Figure 2:
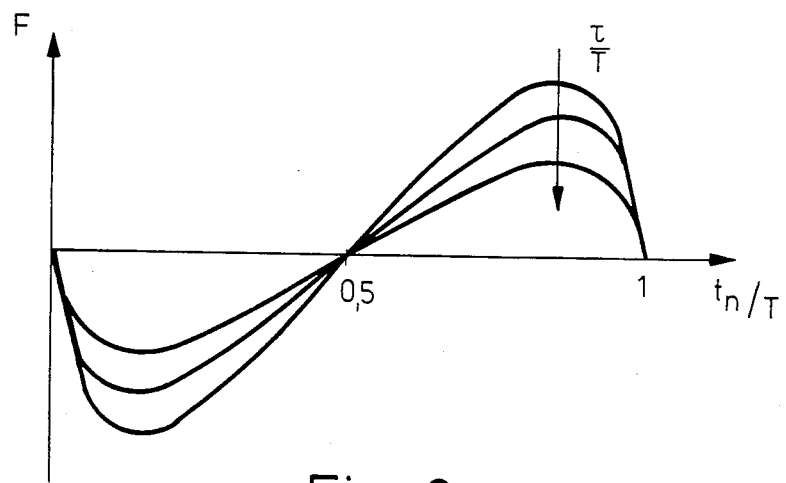
FIG. 2 is a diagram which illustrate the errors which then occur.

The variation of the error F depending on the ratio of the time interval $t_n$ to the period T of the sampled values, is plotted in FIG. 2. As the sampled values lie closer to the signal period, i.e. as the value $\tau/t$ increases, the maximum value of the error F decreases, the basic variation depending on the position of the sampled values relative to the zero crossing being the same. For a very accurate correction of the time intervals $t_n$ and $t_m$, respectively, the instantaneous frequency or period of the signal must be known, which may be approximated by the values last determined assuming that no abrupt change in signal frequency occurs between two half-cycles. In practice, for example, for the demodulation of the frequency-modulated luminance signal contained in a video signal which has been read from a magnetic tape, it is found that the correction of the time intervals $t_n$ and $t_m$ depending on these values, is adequate only for an average frequency of the signal equal to a quarter of the sample frequency. If, by means of the time intervals thus corrected, the duration $\tau$ of a half-cycle of the signal and from this duration the signal frequency is determined, the resulting values are sufficiently accurate.

However, this only yields the values of the durations of the individual half-cycles, but these need not directly constitute a correct representation of the periods of the signal frequency, as will be explained with reference to FIG. 3. In this Figure line (a) shows an input signal whose frequency changes at an exaggerated fast rate. On line (b) the zero-crossing signal is shown, which is generated if immediately after a sampled value a new sampled value with an opposite sign occurs, and this signal is maintained until the next sample. The variation of the zero-crossing signal is also important for the description of the block diagram given hereinafter.

Figure 3:
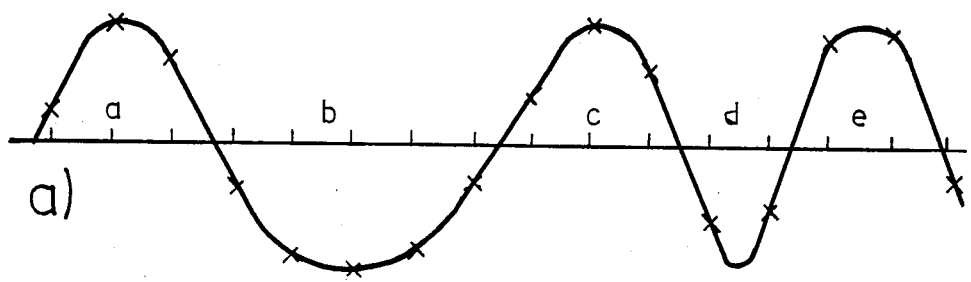
FIG. 3 shows the effects of maintaining the value of the duration of a half-cycle for the length of the next half-cycle and the result of a correction for this effect.
Figure 3:
Figure 3:
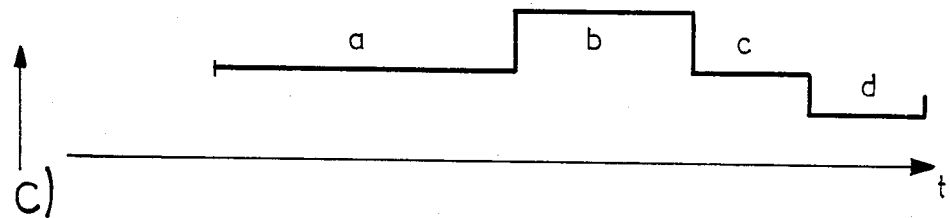
Figure 3:
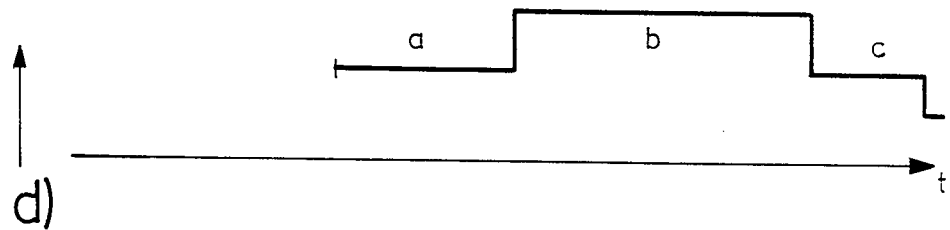
Figure 3:
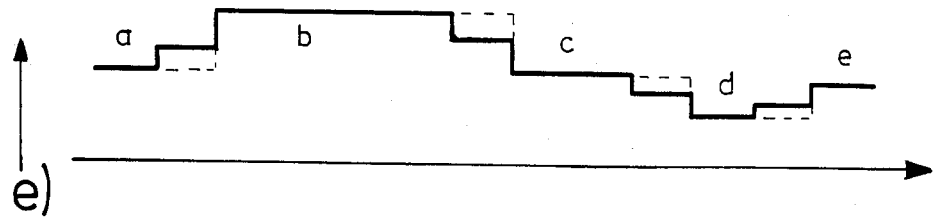

By means of the first zero-crossing signal shown on line (b) in FIG. 3, the value of the duration of the half-cycle a of the input signal is determined. This value is stored until the second zero-crossing signal appears, upon which the value of the duration of the half-cycle b is determined. This applies also to the half-cycles c and d. The values $\tau_n$ of the durations of these individual half-cycles and the periods of time during which these values are stored are represented in FIG. 3 on line (c), the beginning of the value for the duration of the half-cycle a being indicated by a short vertical line, because the preceding half-cycle of the input signal and hence its duration is not shown.

It will be seen that the values for the durations of the individual half-cycles are stored for time intervals whose lengths are not in conformity with the durations of the corresponding half-cycles. For a more accurate approximation, the time during which the value of the duration of each half-cycle is stored must be changed, which is possible by delaying these values by several sampling clock periods. Different values then have to be delayed to a different extent in some cases. The control signal for the delay may be derived from the zero-crossing signal. The values $\tau_v$ which have been delayed to obtain the correct duration are shown on line (d) in FIG. 3. This sequence of values constitutes a substantially better approximation to the actual variation of the periods of the input signal.

On line (e) in FIG. 3 the sequence of values for the individual half-cycle durations a to e has been shifted so that the value for the duration of a half-cycle begins with the first samples value in this half-cycle. It will be appreciated that each value of a half-cycle duration is still shifted to some extent relative to the exact position of this half-cycle, because, in the present example, the zero crossings are each time situated between two sampled values. The shift of the beginning of each new value relative to the first of the two associated adjacent zero crossings, depends on the input signal and varies statistically with this signal, so that any arbitrary other shift (which shift is purely arithmetical and corresponds to an arbitrary constant shift between the input signal and the output signal) can never bring the sequence of values completely into conformity with the input signal.

For a further improvement of the approximation, an intermediate value between the old and the new value is formed before every new value, i.e. in the drawing between the two sampled values on both sides of the zero crossing, which intermediate value depends as follows on the position of the zero crossing between the instants of the sampled values and thus on the values of the time intervals $t_n$ and $t_m$, respectively, in determining the half-cycle durations:

$$\tau_2 = \frac{t_n}{T} \cdot \tau_{n-1} + \frac{(1 - t_n)}{T} \tau_n \quad (3)$$

$$= \frac{t_n}{T} (\tau_{n-1} - \tau_n) + \tau_n$$

Thus, if a zero crossing is situated near the second one of the two consecutive sampled values, the preceding half-cycle has extended far into this interval, and the intermediate value $\tau_z$ is therefore also situated near the value for the duration of the preceding half-cycle and is inverted accordingly. These intermediate values are indicated by a solid line at the relevant points in FIG. 3(e), the uncorrected values being represented by broken lines. The solid line in FIG. 3(e) therefore represents the corrected variation of the values $\tau_{vk}$ of the durations of the half-cycles of the input signal and, even in the cases in which only a few sampled values are situated in each half-cycle and the half-cycle durations vary rapidly, they constitute a good approximation to the actual variation of the half-cycle durations.

Figure 4:
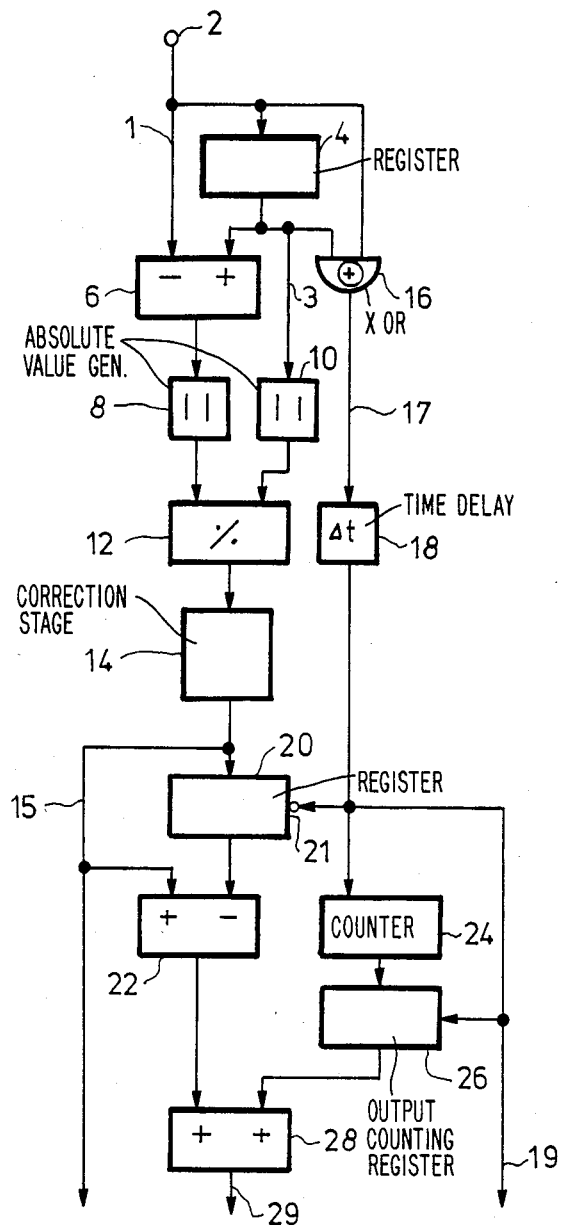
FIG. 4 is a block diagram of a circuit arrangement in accordance with the invention.
Figures 5, 6:
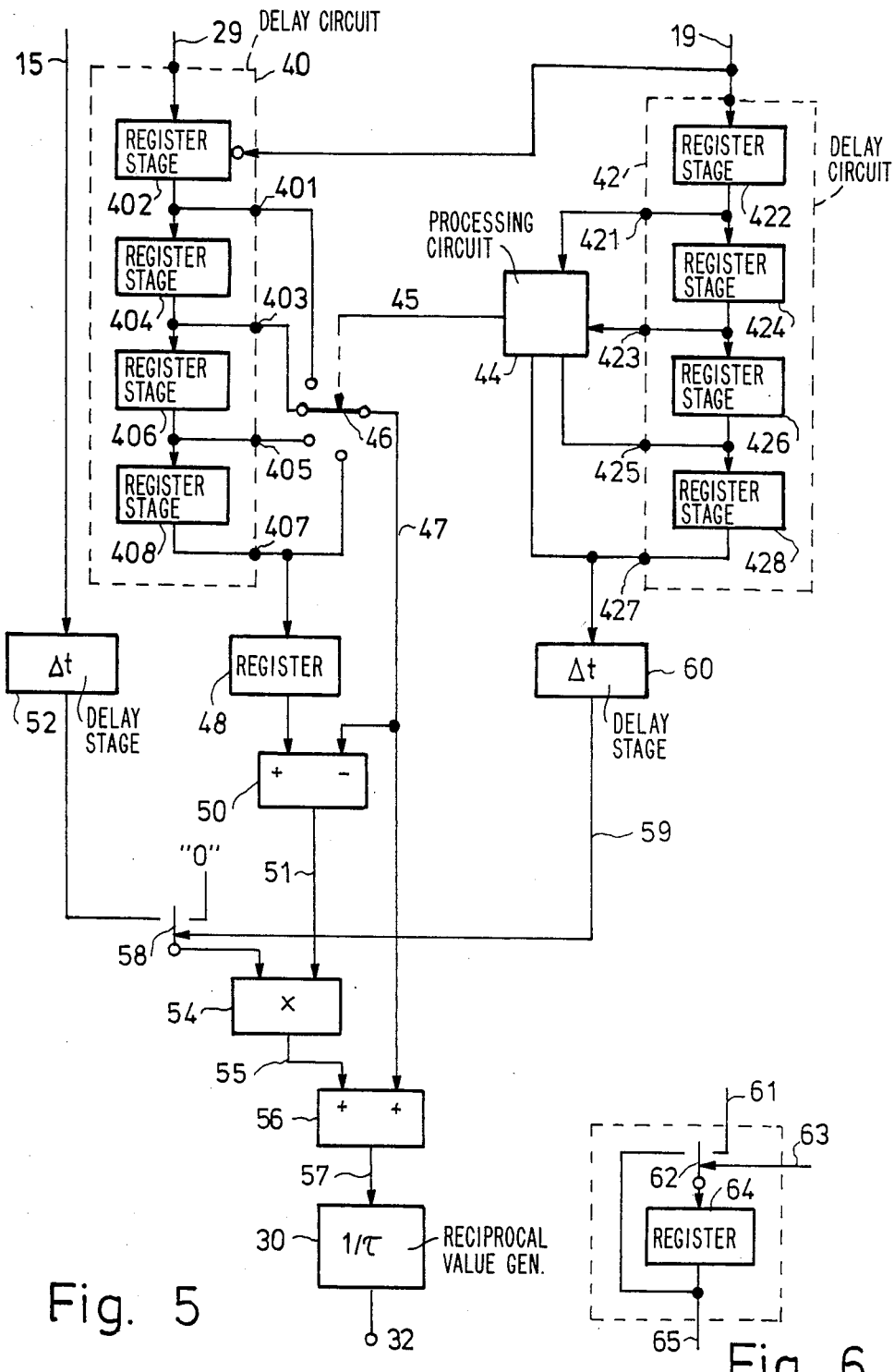
FIG. 5 is the block diagram of a modification to the circuit arrangement shown in FIG. 4.
FIG. 6 shows the basic arrangement of specific delay stages.

Hereinafter the block diagram is described of a circuit arrangement which determines the corrected values of the half-cycle durations obtained in the manner described above, from which values the frequency of an input signal is derived, FIG. 4 showing the arrangement for generating the values plotted in FIG. 3(c) and FIG. 5 showing the block diagram of a circuit arrangement for generating the values which are situated correctly in time and whose transitions have been corrected.

The sequence of sampled values corresponding to the input signal to be modulated is applied to the input 2 of the circuit arrangement in FIG. 4. The sampled values are presented in the form of, for example, multi-bit binary words, whose individual bits are processed in parallel, so that the input 2 in fact comprises a number of parallel inputs for the individual bits of a data word. Therefore, the connection 1 from the input 2 and the other lines shown in FIG. 4 and FIG. 5 also comprise a number of parallel lines corresponding to the number of bits of each data word, except for the lines carrying the zero-crossing signal and signals derived therefrom, such as the lines 17 and 19.

Via connection 1, input 2 is connected to a register 4 which stores a data word upon each clock signal. This clock signal, not shown, which is also applied to other registers, is correlated to the application of the sampled values to input 2, i.e. each time that a new sampled value is applied a pulse of the clock signal appears.

Connection 1 is also connected to a subtractor 6, whose other input is connected to the output of the register 4 and forms the difference between the two values. The output of the subtractor stage 6 is connected to a value-generating stage 8 which generates the absolute value of the difference. For example, for the representation of the sampled values and the binary values derived therefrom, this requires a specific processing of the applied values. The output of the register is also connected via connection 3 to a value-generating stage 10 of a similar type. It follows from equation (2) that only positive values are permissible for the time intervals $t_n$ and in order to simplify division, it is preferred to divide only the absolute values.

This division is performed in the divider stage 12 to which the values generated by the stages 8 and 10 are applied. The multiplication in equation (2) by the duration of the period of the sampled values or the clock signal may be omitted, because this value is a constant scaling factor.

The quotients formed by the divider stage 12 are applied to a correction stage 14 which comprises a read-only memory to which the quotients formed by the divider stage 12 are applied as addresses. At each address, which corresponds to a specific value of the time interval $t_n$, the time interval corrected by the error F for a specific average frequency of the input signal in accordance with FIGS. 1 and 2, is stored and is output via connection 15.

This connection 15 leads to the input of a further register 20, which stores the value on the connection 15 at the end of a zero-crossing signal. This zero-crossing signal, shown in FIG. 3(b) is generated by an exclusive-OR logic network 16, which receives the sign bits of the undelayed sampled value applied to the input 2 and the delayed sampled value supplied by the register 4 and which produces an output signal on the line 17 if the two sign bits are different. If, during processing of the sampled values in the stages 6 to 14, a delay of more than one clock period occurs, which may happen in particular if the divider stage 12 is a pipeline divider, said zero-crossing signal is applied to a time-delay stage 18, which has a delay time equal to said delay. The zero-crossing signal, which may have been delayed, on the output line 19 corresponds in time to the data word applied to the input of the register 20. This register 20 therefore contains a value corresponding to the length of the time interval $t_n$ after each end of the zero-crossing signal, i.e. without a delay after the second sampled value which follows a zero crossing.

This value is applied to the subtraction input of an arithmetic stage 22, whose other input is connected to the output of the correction circuit 14 and receives a value corresponding to the time interval $t_m$ in accordance with FIG. 1 upon the appearance of the next zero crossing.

The line 19 which carries the zero-crossing signal is also connected to the reset input of a counter 24, which receives the clock signal, not shown, as counting clock signal. The output of the counter 24 is connected to an output counting register 26, into which the count is loaded upon each clock signal and consequently upon the appearance of a zero-crossing signal on the line 19. Thus, during each zero-crossing signal the output counting register 26 contains a value corresponding to the number of sampled values, incremented by "1", between the directly preceding two zero crossings of the input signals, assuming that the counter 24 is set to "1" by the zero-crossing signal and the count reached directly before a clock signal is loaded into the register 26 under control of the clock signal edges only. Alternatively, to set the counter 24 to the initial position "1" at the end of the zero-crossing signal, so that the register 26 may be dispensed with or a delay by one clock period is provided in the output line of the arithmetic stage 22 as well as the line 19 and the connection 15.

The outputs of the output counting register 26 and the arithmetic stage 22, in the form of a subtractor, are connected to the inputs of an adder 28, whose output 28 supplies values corresponding to the duration of each half-cycle of the input signal applied to the input 2, which durations do not always appear at the correct instant as is illustrated in FIG. 3(c). Moreover, it is to be noted that in the present circuit arrangement, the stages 6 to 14 and consequently the stages 22 and 28 not only process the values corresponding to two consecutive sampled values on both sides of a zero crossing but also all the other sampled values, so that between two correct values which represent the duration of the last half-cycle, erroneous or useless values appear on output 29. However, this is taken into account during the further processing of these values in the circuit arrangement shown in FIG. 5, which forms the correctly timed durations of the values as shown in FIG. 3(e).

The values appearing on the connection 29 are applied to a delay circuit 40 in FIG. 5, which is constructed as a shift register comprising the series-connected register stages 402, 404, 406 and 408. The value appearing on the connection 29 is loaded into the register stage 402 only at the end of the zero-crossing signal on the line 19, while the other register stages store the value on the input upon each clock signal. Thus, in general, several consecutive stages contain the same values, which is necessary for generating the sequence of values with the correct durations as shown in FIG. 3(d). The tappings 401, 403, 405 and 407 of the delay circuit, which are connected to the outputs of the stages 402, 404, 406 and 408, are connected to the individual position connections of a change-over switch 46, which is suitably constructed as an electronic multiplexer.

The zero-crossing signal on the line 14 is applied to a delay circuit 42 corresponding to the delay circuit 40, which also comprises a number of series-connected stages 422, 424, 426 and 428, which are controlled by the clock signal. Each of these stages contains only one bit in contradistinction to the stages 402 to 408 of the delay circuit 40, which each contain a data word. The tappings 421, 423, 425 and 427 of the delay circuit 42 are connected to the outputs of the corresponding stages 422 to 428 and thus correspond to the tappings of the delay circuit 42.

The tappings 421 to 427 of the delay circuit 42 are connected to the inputs of a processing circuit 44 in the form of a read-only memory, the inputs being the address inputs of the memory. Each address of the memory is thus assigned to a specific combination of signals on the tappings 421 to 427, i.e. a specific pattern of the zero-crossing signal on the line 45, and contains a bit combination which appears on output line 45 and which sets the switch 46 to a well-defined position. As the switch 46 in the present embodiment has four positions, two bits on each address of the read-only memory are sufficient in the selection circuit 44, so that the line 45 in fact comprises two lines. The content of the read-only memory for various signal combinations on the tappings 421 to 427 is specified in the following Table.

TABLE

| 421 | 423 | 425 | 427 | 45 |
|-----|-----|-----|-----|----|
| 0 | 0 | 0 | 0 | * |
| 0 | 0 | 0 | 1 | 3 |
| 0 | 0 | 1 | 0 | 2 |
| 0 | 0 | 1 | 1 | 3 |
| 0 | 1 | 0 | 0 | 1 |
| 0 | 1 | 0 | 1 | 3 |
| 0 | 1 | 1 | 0 | 2 |
| 0 | 1 | 1 | 1 | 3 |
| 1 | 0 | 0 | 0 | 0 |
| 1 | 0 | 0 | 1 | 3 |
| 1 | 0 | 1 | 0 | 2 |
| 1 | 0 | 1 | 1 | 3 |
| 1 | 1 | 0 | 0 | 1 |
| 1 | 1 | 0 | 1 | 3 |
| 1 | 1 | 1 | 0 | 2 |
| 1 | 1 | 1 | 1 | 3 |

In the Table the value "0" on the line 45 means that the switch 46 is connected to the output 401, the other values being assigned to the other outputs in the same sequence. The bit combination yielding the value cannot occur for the relevant frequencies or means such a low frequency relative to the clock frequency that the delay circuits 40 and 42 would become too long.

By controlling the switch 64 in accordance with the Table, the sequence of values for the durations of the consecutive half-cycles is obtained with the correct timing, as shown in FIG. 3(d), on the output connection 47 of the switch 46.

The intermediate values of FIG. 3(e) are generated by means of the other elements shown in FIG. 5. Of these elements the input of a register 48 is connected to the tapping 407 of the delay circuit 40 and, upon each clock signal, the value appearing on this tapping is loaded into the register 48. This value is the value of the period for which the corresponding zero-crossing signal appears simultaneously on the output 427 of the delay circuit 42. When this value has been loaded into the register 48, the value of the next period appears simultaneously on the connection 47 as a result of an appropriate change-over of the switch 46. The output of the register 48 is connected to the adding input of a subtractor 50, whose subtract input is connected to the connection 47, so that at an instant corresponding to the delay caused by the register 48 the difference between the values of the durations of two consecutive half-cycles appears on the output connection 51. The correspondingly delayed zero-crossing signal is taken from the output 59 of a delay stage 60, which is connected to the tapping or output 427 of the delay circuit 42, and this signal actuates a switch whose function will be explained hereinafter.

The connection 51 is connected to one input of a multiplier 54, whose other input is connected to the switch 58. In the absence of a zero-crossing this switch 58 transfers the value "0" to the multiplier 54, so that the value "0" appears on said output connection. When a zero-crossing signal appears the switch 58 connects the relevant input of the multiplier 54 to the output of a delay circuit 52, which has a delay time equal to the sum of the delays of the register 48 and the delay circuit 40 and which may for example be constructed as a shift register with a suitable number of stages. The input of the delay circuit 52 is connected to the connection 15, which carries the value of the time interval $t_m$, which corresponds to the value of the half-cycle duration which appears simultaneously on the connection 47 as a result of the delay produced by the delay circuit 52.

This value is applied to one input of an adder 56, whose other input is connected to the connection 55 of the multiplier 54. Thus, upon a change from the value of the duration of one half-cycle to that of the next half-cycle, an intermediate value between these two values is generated on its output connection 57. The corrected values of the individual half-cycle durations thus produced on the output connection 57 are applied to the input of the reciprocal-value generator 30, which suitably comprises a read-only memory, whose address lines are connected to the input of the reciprocal-value generator 30 and which transfers the data on these addresses to the output 32 of the arrangement. These values appearing on the output 32 represent the sequence of the instantaneous frequencies of the input signal corresponding to the sampled values applied to the input 2, with a constant time delay, which in the present example is mainly caused by the delay circuit 40. The time delay of the delay circuit 40 and consequently that of the delay circuit 42 depends on the duration of the longest half-cycle occurring in the input signal, and strictly speaking on the difference between the smallest and the longest duration of the actually occurring half-cycles of the input signal. The shift in time between the input signal and the output signals on output 32, which represent its instantaneous frequency, may increase of, in particular, the individual arithmetic stages are followed by delay stage, in which case care must be taken that the delays introduced in all the parallel signal paths are the same, in order to compensate for the propagation delays of the signals in the individual arithmetic stages, so that said delay can be substantially equal to the period of the clock signal. However, for the sake of clarity, such additional delay stages are not shown.

Suitably, the register stages and delay stages used in the present example and, as the case may be, additional stages, are constructed as accumulator registers, which are all operated with the clock signal, i.e. which take up the input value and transfer it to the output upon each clock pulse. This is particularly favorable if the complete circuit arrangement is constructed as an integrated circuit in dynamic MOS-technology. In order to enable the register stages and delay stages, which must take over a value only when a zero-crossing signal appears, to be constructed in the same way, it is effective to use the arrangement shown in FIG. 6. This arrangement comprises a register 64 which is operated with the general clock signal. The input of this register 64 is preceded by a switch 62, which under control of the zero-crossing signal via the line 63 connects the input 61 of the stage to the input of the register 64. In the absence of a zero-crossing signal on the line 63 the input of the register 64 is connected to its output 65, so that its contents is not changed upon the next clock signals.

What is claimed is:

1. A method of demodulating a frequency-modulated periodic input signal by determining the duration of each half-cycle between every two adjacent zero crossings of the input signal, which signal appears in the form of a sequence of digitized samples taken from the input signal at regular intervals, and by generating the reciprocals of the durations of the half-cycles, characterized in that the method comprises the steps:

deriving the time intervals $t_n$ and $t_m$, respectively, between each zero crossing and the sample which directly precedes it, from two consecutive samples $a_n$, $a_{n+1}$ and $a_m$, $a_{m+1}$, respectively, of different signs at the locations of the zero crossings using the relationship $$t_n = T\frac{|a_{n-1}|}{|a_{n-1} - a_n|}$$

$$t_m = T\frac{|a_{m-1}|}{|a_{m-1} - a_m|};$$

determining the sum of the time intervals T corresponding to a number n of samples between adjacent zero crossings; and deriving the duration $\tau$ of each half-cycle using the relationship $$\tau = (T - t_n) + nT + t_m$$
$$= t_m - t_n + (n + 1)T.$$

2. A method as claimed in claim 1, characterized in that prior to the determination of the half-cycle duration each time interval $t_n$, $t_m$ is corrected by a correction value which depends on the value of said time interval.

3. A method as claimed in claim 1 or 2, characterized in that the duration determined for each half-cycle is stored for a time period equal to the time duration of a number of samples which is 1 higher than the number of samples between a first of a next two adjacent zero crossings and a preceding zero crossing used in determining said half-cycle duration.

4. A method as claimed in claim 3, characterized in that a period $\tau_{nk}$ is assigned to the time interval between the consecutive samples $a_n$, $a_{n+1}$ at the location of the first one of the two zero crossings which period, depending on the time interval $t_n$ between this zero crossing and the preceding sample, is situated between the period $\tau_{n-1}$ determined before this zero crossing and the last period determined $\tau_n$ in conformity with the following relationship:

$$\tau_{nk} = \frac{t_n}{T}(\tau_{n-1} - \tau_n) + \tau_n.$$

5. An arrangement for demodulating a frequency-modulated periodic input signal by determining the duration of each half-cycle between every two adjacent zero crossings of the input signal, which signal appears in the form of a sequence of digital samples taken from the input signal at regular intervals, and by generating the reciprocals of the durations of the half-cycles, which arrangement comprises an input, to which the digital samples are consecutively applied in the rhythm of a clock signal, and an output which supplies data words in the same rhythm, which represents the instantaneous frequency of the input signal represented by the applied samples values, characterized in that the arrangement comprises a first delay stage for delaying each digital sample applied to the input by one period of the clock signal; an exclusive-OR logic circuit which receives the sign signal of each sampled value which has been delayed and applied to the input of the arrangement, and which generates a zero-crossing signal if the two sign signals are different; a first arithmetic stage coupled to the input of the arrangement and to the output of the first delay stage, which first arithmetic stage supplies the difference between two consecutive sampled values; a divider stage having inputs coupled to the output of the first arithmetic stage and the output of the first delay stage, for forming the quotients of the values supplied by said stages; a second delay stage having an input coupled to the output of the divider stage for storing, under control of the zero-crossing signal, the quotients of the sampled values of different signs before a new quotient appears; a counter having an output counting register, which counter receives the clock signal as a counting signal and upon receiving the zero-crossing signal, loads the count into the output counting register and is reset to an initial position; a second arithmetic stage having a first input coupled to the output of the divider stage, a second input coupled to the output of the second delay stage and a third input coupled to the output of the output counting register, said second arithmetic stage forming the difference between the value applied to the second input and the sum of the values applied to the first and the third inputs; and a reciprocal-value generator having an input coupled to the output of the second arithmetic stage and an output connected to the output of the arrangement.

6. An arrangement as claimed in claim 5, characterized in that the divider stage is followed by a correction circuit, which corrects each quotient supplied by the divider stage by a correction value which depends at least on said quotient.

7. An arrangement as claimed in claim 6, characterized in that the correction circuit is a read-only memory whose address inputs are coupled to at least the output of the divider stage and whose data outputs are coupled to the input of the second delay stage and one input of the second arithmetic stage.

8. An arrangement as claimed in claim 5, 6 or 7, characterized in that said arrangement further comprises a first delay circuit for delaying a plurality of data words, which first delay circuit comprises a plurality of tappings, said first delay circuit having an input coupled to the output of the second arithmetic unit and which, upon each zero-crossing signal, takes over a data word; a multi-position switch having inputs coupled respectively to said tappings; a second delay circuit having tappings corresponding to those of the first delay circuit, which second delay circuit receives the zero-crossing signal; and a processing circuit to which said second delay circuit tapping are connected, which processing circuit, depending on the combination of signals on the second delay circuit tappings, generates a control signal which sets the switch to a position assigned to said combination, the input of the reciprocal-value generator being coupled to an output of the switch.

9. An arrangement as claimed in claim 8, characterized in that the first and the second delay circuits are constructed as shift registers each comprising a plurality of stages which are controlled by the clock signal, each stage in the first delay circuit storing a data word, and the tappings are the outputs of the individual stages.

10. An arrangement as claimed in claim 8, characterized in that the output of the switch is connected to an input of a third arithmetic stage, which has another input coupled to the last tapping of the first delay circuit via a third delay stage which delays each data word applied by one clock period, said third arithmetic stage having an output which supplies the difference between the values applied to the two inputs and is coupled to a first input of a fourth arithmetic stage, a second input thereof being coupled, via a fourth delay stage, whose delay time is equal to the sum of the delay times of the first or the second delay circuit and the third delay stage, to the output of the divider stage or the correction circuit following it, and a third input thereof being coupled to the output of the switch and, under control of zero-crossing signal which has been delayed by the delay of the first or second delay circuit in the clock period before the application of a new value to the output of the switch, adds the product of the values applied to the first and the second input of the fourth arithmetic stage and in the other clock periods adds the value "0" to the output signal of the switch and supplies the sum to the reciprocal-value generator.

11. An arrangement as claimed in claim 10, characterized in that said arrangement comprises at least one switch which is arranged before the first or the second input of the fourth arithmetic stage and which is controlled by the zero-crossing signal, which switch applies a data word of the value "0" to the relevant input in the absence of a zero-crossing signal.

12. An arrangement as claimed in claim 5, 6, or 7, characterized in that the reciprocal-value generator is a read-only memory, whose address input is connected to the output of the second arithmetic stage and whose data output is connected to the output of the arrangement.

13. An arrangement as claimed in claim 9, characterized in that the second delay stage and/or the first stage of the first delay circuit comprise a register stage which is controlled by the clock signal and a second switch which is controlled by the zero-crossing signal, for the storage of values appearing simultaneously with the zero-crossing signal, which switch connects the output of the register stage to its input in the absence of a zero-crossing signal.

14. An arrangement as claimed in claim 10, characterized in that the reciprocal-value generator is a read-only memory, whose address input is connected to the output of the fourth arithmetic stage and whose data output is connected to the output of the arrangement.

15. An arrangement as claimed in claim 11, characterized in that the reciprocal-value generator is a read-only memory, whose address input is connected to the output of the fourth arithmetic stage and whose data output is connected to the output of the arrangement.

* * * * *